(12) United States Patent
Morikazu et al.

(10) Patent No.: US 10,780,524 B2
(45) Date of Patent: Sep. 22, 2020

(54) LASER PROCESSING METHOD AND LASER PROCESSING APPARATUS

(71) Applicant: DISCO CORPORATION, Tokyo (JP)

(72) Inventors: Hiroshi Morikazu, Tokyo (JP); Noboru Takeda, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 215 days.

(21) Appl. No.: 15/919,934

(22) Filed: Mar. 13, 2018

(65) Prior Publication Data

US 2018/0257174 A1 Sep. 13, 2018

(30) Foreign Application Priority Data

Mar. 13, 2017 (JP) .................... 2017-047589

(51) Int. Cl.
| | | |
|---|---|---|
| *B23K 26/0622* | (2014.01) | |
| *B23K 26/00* | (2014.01) | |
| *H01L 21/78* | (2006.01) | |
| *B23K 26/06* | (2014.01) | |
| *B23K 37/04* | (2006.01) | |

(52) U.S. Cl.
CPC ...... *B23K 26/0622* (2015.10); *B23K 26/0006* (2013.01); *B23K 26/0604* (2013.01); *B23K 37/0461* (2013.01); *H01L 21/78* (2013.01)

(58) Field of Classification Search
CPC ............ B23K 26/0622; B23K 37/0461; B23K 26/0604

USPC ............ 219/121.62, 121.68, 121.69, 121.72; 372/18, 20, 25, 30

See application file for complete search history.

(56) References Cited

U.S. PATENT DOCUMENTS

| | | | | |
|---|---|---|---|---|
| 2001/0009250 A1* | 7/2001 | Herman | ................. | C03B 29/02 |
| | | | | 219/121.69 |
| 2007/0272555 A1* | 11/2007 | Baird | ................... | B23K 26/083 |
| | | | | 204/569 |
| 2007/0272668 A1* | 11/2007 | Albelo | ................ | B23K 26/386 |
| | | | | 219/121.72 |
| 2011/0259861 A1* | 10/2011 | Crist | ..................... | B23K 26/36 |
| | | | | 219/121.72 |
| 2012/0064695 A1* | 3/2012 | Boyle | ................. | B28D 5/0011 |
| | | | | 438/462 |

FOREIGN PATENT DOCUMENTS

| | | |
|---|---|---|
| JP | 10305420 A | 11/1998 |
| JP | 2002192370 A | 7/2002 |
| JP | 2014221483 A | 11/2014 |

\* cited by examiner

*Primary Examiner* — Thien S Tran

(74) *Attorney, Agent, or Firm* — Greer Burns & Crain Ltd.

(57) ABSTRACT

Disclosed herein is a laser processing method including a first application step of applying a first laser beam having a pulse width shorter than time of electron excitation generated by application of a laser beam to a workpiece, and a second application step of applying a second laser beam within the electron excitation time.

20 Claims, 6 Drawing Sheets

LASER PROCESSING METHOD AND LASER PROCESSING APPARATUS

BACKGROUND OF THE INVENTION

Field of the Invention

The present invention relates to a laser processing method and a laser processing apparatus by which enhanced processing quality can be realized.

Description of the Related Art

A wafer formed with a plurality of devices such as integrated circuits (ICs) and large scale integrations (LSIs) on a front surface thereof partitioned by a plurality of intersecting division lines is divided into individual device chips by a laser processing apparatus, and the device chips thus divided are utilized for electric apparatuses such as mobile phones and personal computers. As the laser processing apparatus, there are those of the following types (1) to (3), and the laser processing apparatus to be used is appropriately selected taking the kind of the workpiece and processing conditions into consideration.

(1) A type in which a pulsed laser beam of such a wavelength as to be absorbed in the workpiece is applied to perform ablation, thereby forming grooves in division lines and dividing the workpiece into individual device chips (see, for example, Japanese Patent Laid-Open No. Hei 10-305420).

(2) A type in which a pulsed laser beam of such a wavelength as to be transmitted through the workpiece is applied to the wafer, with the focal point of the laser beam positioned inside of division lines, to form modified layers inside the division lines, and thereafter an external force is applied to the wafer, thereby dividing the wafer into individual device chips (see, for example, Japanese Patent No. 3408805).

(3) A type in which a pulsed laser beam of such a wavelength as to be transmitted through the workpiece is applied to the wafer, with a focused region of the laser beam positioned inside the wafer correspondingly to division lines, to form a plurality of minute holes extending from the front surface to the back surface of the wafer correspondingly to the division lines and amorphous portions surrounding the minute holes, thereby dividing the wafer into individual device chips (see, for example, Japanese Patent Laid-Open No. 2014-221483).

SUMMARY OF THE INVENTION

The quality of laser processing depends not only on the output, repetition frequency, pulse width, and spot diameter of a laser beam oscillated by a laser oscillator but also on elements of processing inclusive of feed speed of the workpiece, and the processing conditions are set by suitably adjusting the elements of processing. For realizing further enhanced quality of laser processing, however, the conventional adjustment of the elements of processing as above-mentioned has limitations.

It is therefore an object of the present invention to provide a laser processing method and a laser processing apparatus by which further enhanced quality of laser processing can be realized.

In accordance with an aspect of the present invention, there is provided a laser processing method for processing a workpiece by applying a laser beam to the workpiece, the laser processing method including a first application step of applying a first laser beam having a pulse width shorter than time of electron excitation generated by application of a laser beam to the workpiece, and a second application step of applying a second laser beam within the electron excitation time.

Preferably, after the first application step and the second application step are conducted, the first application step and the second application step in a next run are performed after a time interval of not less than a time required for release of heat generated in the workpiece.

In accordance with another aspect of the present invention, there is provided a laser processing apparatus including a chuck table adapted to hold a workpiece, and laser beam applying means for applying a laser beam to the workpiece held by the chuck table. The laser beam applying means includes a laser oscillator adapted to oscillate a pulsed laser beam having a pulse width shorter than time of electron excitation generated by application of the laser beam to the workpiece, and a second laser beam is applied within the time of electron excitation generated by application of the first laser beam to the workpiece.

Preferably, after the first laser beam and the second laser beam are applied, the first laser beam and the second laser beam in a next run are applied after a time interval of not less than a time required for release of heat generated in the workpiece.

According to the laser processing method of the present invention, the second laser beam is applied in a state in which electrons surrounding the atoms constituting the workpiece are activated by the first laser beam, whereby processing is promoted, and enhanced quality of laser processing can be realized.

According to the laser processing apparatus of the present invention, the second laser beam is applied within the time of electron excitation generated by application of the first laser beam to the workpiece, so that the second laser beam is applied in a state in which electrons surrounding the atoms constituting the workpiece are activated by the first laser beam, whereby processing is promoted, and enhanced quality of laser processing can be realized.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
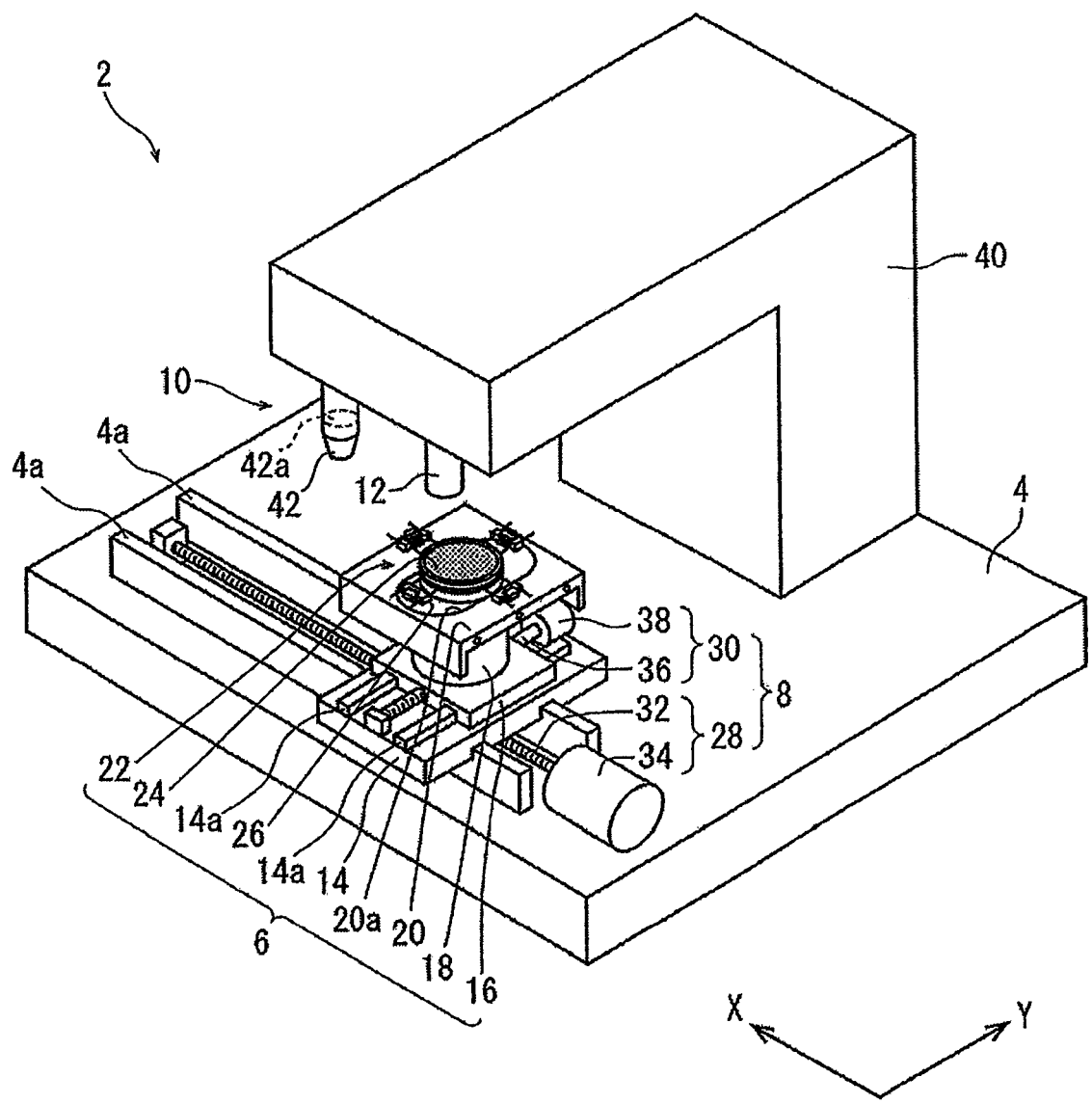
FIG. 1 is a perspective view of a laser processing apparatus according to an embodiment of the present invention.

In the first place, a first embodiment of a laser processing apparatus configured according to the present invention and a laser processing method using the laser processing apparatus will be described referring to FIGS. 1 to 3. A laser processing apparatus 2 illustrated in FIG. 1 includes a base 4, holding means 6 for holding a workpiece, moving means 8 for moving the holding means 6, laser beam applying means 10 for applying a pulsed laser beam to the workpiece held by the holding means 6, and imaging means 12 for imaging the workpiece held by the holding means 6.

As depicted in FIG. 1, the holding means 6 includes a rectangular X-direction movable plate 14 mounted on the base 4 so as to be movable in an X-direction, a rectangular Y-direction movable plate 16 mounted on the X-direction movable plate 14 so as to be movable in a Y-direction, a cylindrical support column 18 fixed to an upper surface of the Y-direction movable plate 16, and a rectangular cover plate 20 fixed to an upper end of the support column 18. The cover plate 20 is formed with a slot 20a extending in the Y-direction, and a circular chuck table 22 extending upward via the slot 20a is mounted on an upper end of the support column 18 in a rotatable manner. A circular suction chuck 24 formed from a porous material and extending substantially horizontally is disposed on an upper surface of the chuck table 22, and the suction chuck 24 is connected to suction means (not depicted) through a passage. In the chuck table 22, a suction force is generated at an upper surface of the suction chuck 24 by the suction means, whereby a workpiece mounted on the upper surface of the suction chuck 24 can be held by suction. In addition, near the circumferential edge of the chuck table 22, a plurality of clamps 26 are disposed at intervals along the circumferential direction. Note that the X-direction is a direction indicated by arrow X in FIG. 1, and the Y-direction is a direction indicated by arrow Y in FIG. 1 and orthogonal to the X-direction. A plane defined by the X-direction and the Y-direction is substantially horizontal.

The moving means 8 includes X-direction moving means 28 for moving the chuck table 22 in the X-direction, Y-direction moving means 30 for moving the chuck table 22 in the Y-direction, and rotating means (not depicted) for rotating the chuck table 22 about an axis extending in the vertical direction. The X-direction moving means 28 has a ball screw 32 extending in the X-direction on the base 4, and a motor 34 connected to one end portion of the ball screw 32. A nut portion (not depicted) of the ball screw 32 is fixed to a lower surface of the X-direction movable plate 14. The X-direction moving means 28 converts a rotational motion of the motor 34 into a rectilinear motion and transmits the rectilinear motion to the X-direction movable plate 14, by the ball screw 32, to advance or retract the X-direction movable plate 14 in the X-direction along guide rails 4a on the base 4, whereby the chuck table 22 is advanced or retracted in the X-direction. The Y-direction moving means 30 has a ball screw 36 extending in the Y-direction on the X-direction movable plate 14, and a motor 38 connected to one end portion of the ball screw 36. A nut portion (not depicted) of the ball screw 36 is fixed to a lower surface of the Y-direction movable plate 16. The Y-direction moving means 30 converts a rotational motion of the motor 38 into a rectilinear motion and transmits the rectilinear motion to the Y-direction movable plate 16, by the ball screw 36, to advance or retract the Y-direction movable plate 16 in the Y-direction along guide rails 14a on the X-direction movable plate 14, whereby the chuck table 22 is advanced or retracted in the Y-direction. The rotating means has a motor (not depicted) incorporated in the support column 18, and rotates the chuck table 22, in relation to the support column 18, about an axis extending in the vertical direction.

The laser beam applying means (laser beam applying unit) 10 includes a frame body 40 extending upward from the upper surface of the base 4 and then extending substantially horizontally, a focusing unit 42 disposed at a lower surface of a tip of the frame body 40, and focal point position adjusting means (not depicted). The focusing unit 42 incorporates a focusing lens 42a for focusing and applying the laser beam to the workpiece held on the chuck table 22 of the holding means 6. In addition, the imaging means (imaging unit) 12 is attached to the lower surface of the tip of the frame body 40, at a position spaced from the focusing unit 42 in the X-direction.

Figure 2:
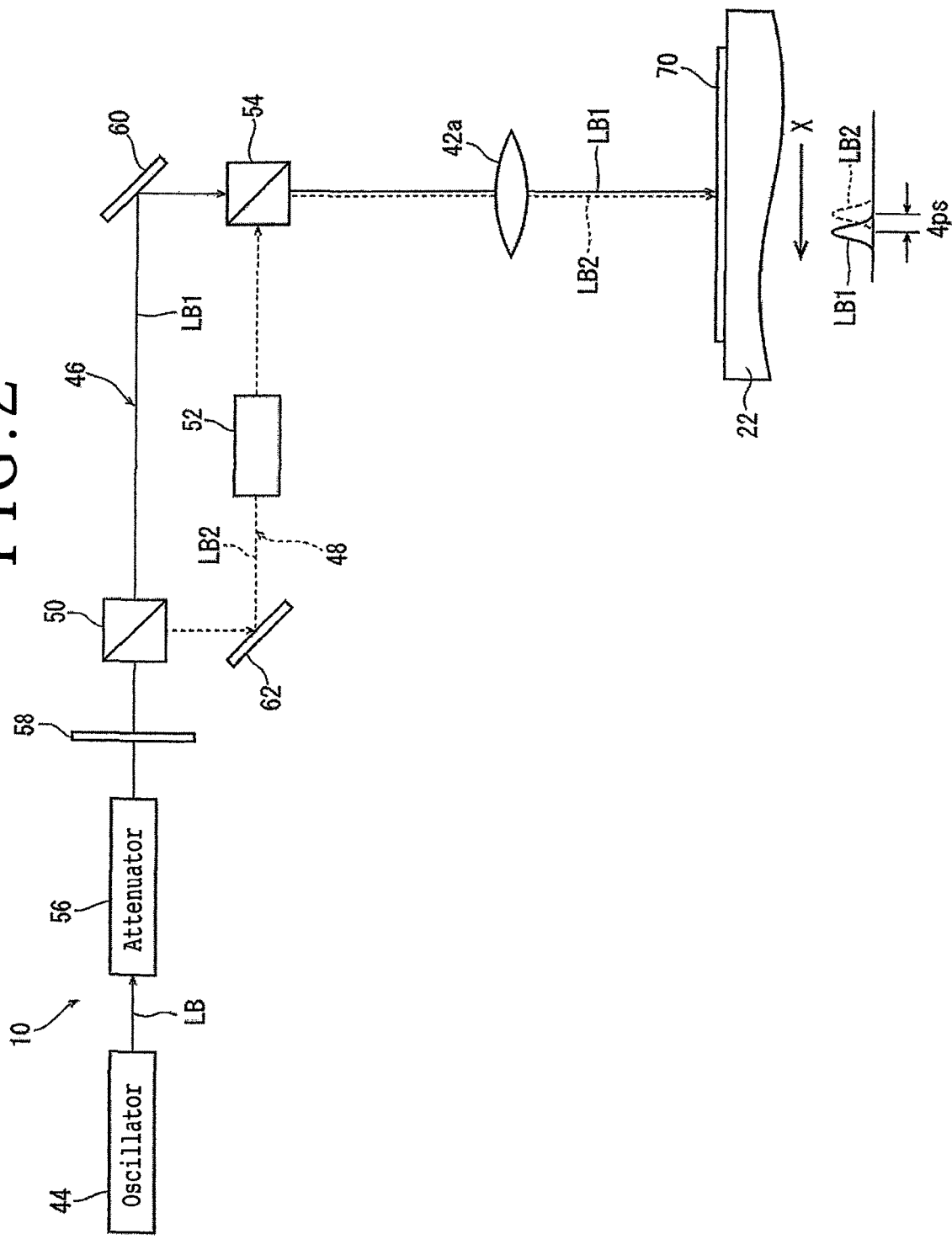
FIG. 2 is a block diagram of laser beam applying means according to a first embodiment.

Referring to FIG. 2, the laser beam applying means 10 includes a laser oscillator 44, a first polarization beam splitter 50, a light-delaying optical body 52, and a second polarization beam splitter 54. The laser oscillator 44 oscillates a pulsed laser beam LB having a pulse width shorter than time of electron excitation generated by application of a laser beam to the workpiece such as a wafer (the time will hereinafter be referred to as "electron excitation time"). The first polarization beam splitter 50 branches the pulsed laser beam LB oscillated by the laser oscillator 44, guides a first pulsed laser beam LB1 into a first optical path 46, and guides a second pulsed laser beam LB2 into a second optical path 48. The light-delaying optical body 52 is disposed in the second optical path 48 and delays the second pulsed laser beam LB2 in relation to the first pulsed laser beam LB1 by a time shorter than the electron excitation time. The second polarization beam splitter 54 causes the first optical path 46 and the second optical path 48 to join each other. In the first embodiment, as depicted in FIG. 2, the laser beam applying means 10 further includes an attenuator 56, a half-wave plate 58, a first mirror 60, and a second mirror 62. The attenuator 56 regulates the output of the pulsed laser beam LB oscillated by the laser oscillator 44. The half-wave plate 58 is disposed between the laser oscillator 44 and the first polarization beam splitter 50 (in the present embodiment, between the attenuator 56 and the first polarization beam splitter 50). The first mirror 60 bends the first optical path 46 at right angles and guides the first pulsed laser beam LB1 to the second polarization beam splitter 54. The second mirror 62 bends the second optical path 48 at right angles and guides the second pulsed laser beam LB2 to the second polarization beam splitter 54.

The pulse width of the pulsed laser beam LB oscillated by the laser oscillator 44 is shorter than the electron excitation time; for example, in the case where the workpiece is sapphire ($Al_2O_3$) for which the electron excitation time is approximately 8 ps ($8 \times 10^{-12}$ second), the pulse width is preferably set to approximately 1 ps. The wavelength of the pulsed laser beam LB oscillated by the laser oscillator 44 is, for example, 355 nm, 1064 nm or the like, which is appropriately determined according to the kind of processing. The pulsed laser beam LB oscillated by the laser oscillator 44 is regulated by the attenuator 56 to an appropriate output according to the kind of processing, before being incident on the half-wave plate 58. The pulsed laser beam LB incident on the half-wave plate 58 is regulated by the half-wave plate 58 in such a manner that the quantity of a p-polarized light component with plane of polarization being p-polarized light when incident on the first polarization beam splitter 50 and the quantity of an s-polarized light component with plane of polarization being s-polarized light when incident on the first polarization beam splitter 50 are adjusted appropriately (for example, adjusted to be equal). The first polarization beam splitter 50 is so configured as to transmit the p-polarized light component of the incident pulsed laser beam LB, thereby guiding the first pulsed laser beam LB1 into the first optical path 46, and to reflect the s-polarized light component of the incident pulsed laser beam LB, thereby guiding the second pulsed laser beam LB2 into the second optical path 48.

The first pulsed laser beam LB1 guided into the first optical path 46 is reflected by the first mirror 60, to be incident on the second polarization beam splitter 54. On the other hand, the second pulsed laser beam LB2 guided into the second optical path 48 is reflected by the second mirror 62, to be incident on the light-delaying optical body 52. The light-delaying optical body 52 can be configured, for example, by use of a glass piece having a predetermined length in the light propagation direction of the second optical path 48. The length of the light-delaying optical body 52 in the light propagation direction of the second optical path 48 is determined based on a delay time by which the second pulsed laser beam LB2 is delayed in relation to the first pulsed laser beam LB1 by a time shorter than the electron excitation time by the light-delaying optical body 52, and the refractive index of the light-delaying optical body 52. For example, when the workpiece is sapphire for which the electron excitation time is approximately 8 ps, the delay time is preferably set to approximately 4 ps; for producing a delay time of 4 ps in the case where the light-delaying optical body 52 is composed of a glass piece having a refractive index of 1.5, the length of the light-delaying optical body 52 in the light propagation direction of the second optical path 48 is approximately 2.5 mm. The second pulsed laser beam LB2 transmitted through the light-delaying optical body 52 is incident on the second polarization beam splitter 54 with a delay of a predetermined delay time shorter than the electron excitation time, in relation to the first pulsed laser beam LB1. Note that the light-delaying optical body 52 need only delay one of the first pulsed laser beam LB1 and the second pulsed laser beam LB2 in relation to the other of the first pulsed laser beam LB1 and the second pulsed laser beam LB2, and, therefore, the light-delaying optical body 52 may be disposed in the first optical path 46, and may delay the first pulsed laser beam LB1 in relation to the second pulsed laser beam LB2 by a predetermined delay time shorter than the electron excitation time.

The second polarization beam splitter 54 in the present embodiment is so configured as to transmit the p-polarized light component of the incident pulsed laser beam LB, and reflect the s-polarized light component of the incident pulsed laser beam LB, thereby changing the optical path of the s-polarized light component. The first pulsed laser beam LB1 with plane of polarization being p-polarized light also when incident on the second polarization beam splitter 54 is transmitted through the second polarization beam splitter 54, whereas the second pulsed laser beam LB2 with plane of polarization being s-polarized light also when incident on the second polarization beam splitter 54 is reflected by the second polarization beam splitter 54 and has its optical path changed thereby, so that the first optical path 46 and the second optical path 48 are caused by the second polarization beam splitter 54 to join each other. Then, the first pulsed laser beam LB1 is focused by the focusing lens 42a and applied to the workpiece, whereas the second pulsed laser beam LB2 is focused by the focusing lens 42a and applied to the workpiece, with a delay of a predetermined delay time shorter than the electron excitation time in relation to the first pulsed laser beam LB1. In other words, the laser beam applying means 10 can apply the first pulsed laser beam LB1 to the workpiece and then apply the second pulsed laser beam LB2 to the workpiece within the time of electron excitation generated by application of the first pulsed laser beam LB1 to the workpiece.

The repetition frequency of the pulsed laser beam LB oscillated by the laser oscillator 44 is conveniently set to be not more than a value obtained by dividing one second by the time required for release of the heat generated in the workpiece after the first pulsed laser beam LB1 and the second pulsed laser beam LB2 are applied to the workpiece. For example, in the case where the workpiece is sapphire for which the time required for release of the heat generated in the workpiece by application of a laser beam (the time will hereinafter be referred to as "heat release time") is approximately 1 μs ($1 \times 10^{-6}$ second), the value obtained by dividing one second by the heat release time for sapphire of 1 μs is $1 \times 10^6$, and, therefore, the repetition frequency of the pulsed laser beam LB oscillated by the laser oscillator 44 is preferably set to be not more than 1 MHz ($1 \times 10^6$ Hz). With the repetition frequency set in this way, the laser beam applying means 10, after applying the first pulsed laser beam LB1 and the second pulsed laser beam LB2 to the workpiece, applies the first pulsed laser beam LB1 and the second pulsed laser beam LB2 in the next run to the workpiece after a time interval of not less than the heat release time. As a result of this, thermal influences of laser processing are restrained from being exerted on the workpiece, and enhanced quality of laser processing can be realized.

Figure 3:
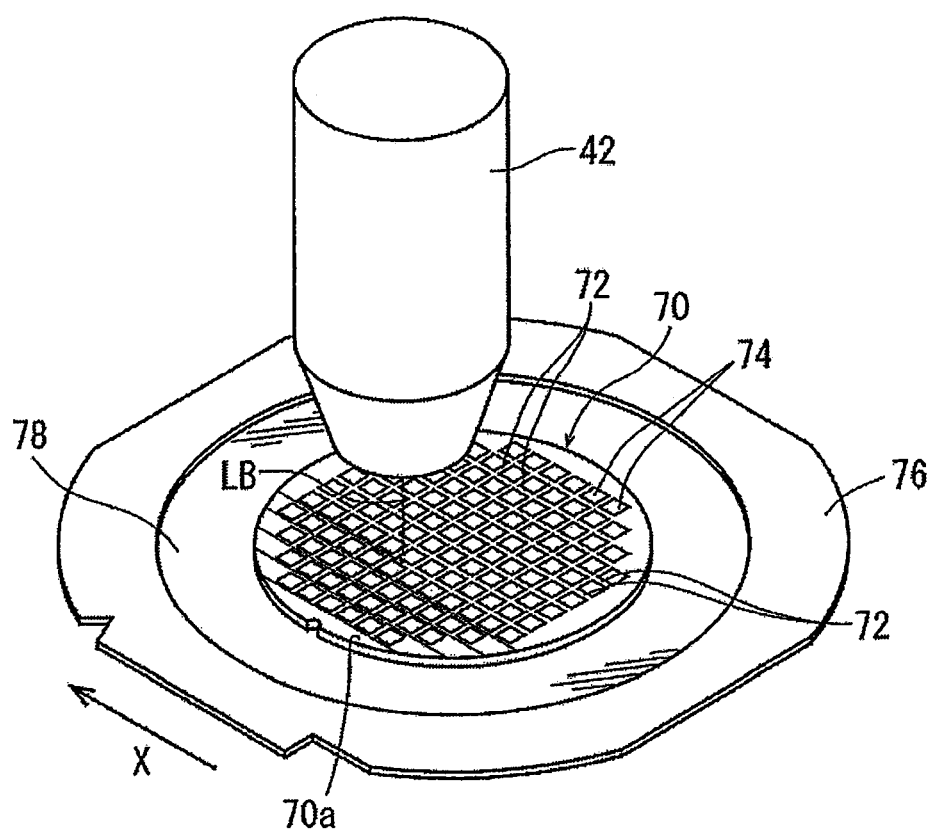
FIG. 3 is a perspective view of a state in which a laser beam is applied to a wafer.

A front surface 70a of a disk-shaped wafer 70 depicted in FIG. 3 is partitioned by a plurality of crossing division lines 72 into a plurality of rectangular regions, and a device 74 such as an IC or an LSI is formed in each of the plurality of rectangular regions. In the present embodiment, a back surface of the wafer 70 is attached to an adhesive tape 78 of which a peripheral edge is fixed to an annular frame 76. Note that the front surface 70a of the wafer 70 may be attached to the adhesive tape 78.

In applying laser processing to the wafer 70 by use of the laser processing apparatus 2, first, a wafer holding step is conducted in which the wafer 70 is held on an upper surface of the chuck table 22, with the front surface 70a of the wafer 70 oriented upward, and an outer peripheral edge portion of the annular frame 76 is fixed by the plurality of clamps 26. Next, an alignment step is performed in which the wafer 70 is imaged from above by the imaging means 12, and, based on an image of the wafer 70 obtained by the imaging by the imaging means 12, the chuck table 22 is moved and rotated by the moving means 8 so that the crossing division lines 72 are aligned with the X-direction and the Y-direction. Subsequently, a focal point position adjusting step is conducted in which the focusing unit 42 is positioned on the upper side of one end portion of the division line 72 aligned with the X-direction, and the focusing unit 42 is lifted upward or downward by the focal point position adjusting means so as to adjust the position of the focal point in the vertical direction. Note that the diameter of the focal point is appropriately determined according to the kind of processing, and is, for example, 1 to 20 μm.

Next, a first application step of applying to the wafer 70 the first pulsed laser beam LB1 having a pulse width shorter than the time of electron excitation generated by application of a laser beam to the wafer 70, and a second application step of applying the second pulsed laser beam LB2 to the wafer 70 within the electron excitation time of the wafer 70, are conducted. As aforementioned, in the laser processing apparatus 2, the pulse width of the pulsed laser beam LB oscillated by the laser oscillator 44 is set to be shorter than the electron excitation time of the workpiece, and the second pulsed laser beam LB2 can be applied to the workpiece within the time of electron excitation generated by application of the first pulsed laser beam LB1 to the workpiece. Therefore, the first application step and the second application step can be carried out by use of the laser processing apparatus 2. With the first application step and the second application step performed, the second pulsed laser beam LB2 is applied in a state in which electrons surrounding the atoms constituting the wafer 70 are activated by the first pulsed laser beam LB1, so that processing is promoted, and enhanced quality of laser processing can be realized.

For example, in the case of performing modified layer forming processing in which a laser beam such as to be transmitted through a wafer 70 is applied to the wafer 70 to form modified layers inside division lines 72, it is possible, by carrying out the first application step and the second application step, to form comparatively long modified layers inside the division lines 72 in the direction of incidence of the laser beam. After the first application step and the second application step in the first run are performed, dividing processing in which the first application step and the second application step are alternately repeated, while performing processing feeding of the chuck table 22 in the X-direction relative to the focal point at a predetermined processing feed speed (which may, for example, be 500 mm/second, and is appropriately determined taking the repetition frequency into consideration) by the X-direction moving means 28, is conducted along the division lines 72, as depicted in FIG. 3. The dividing processing is applied to all the division lines 72 aligned to the X-direction, while performing indexing feeding of the chuck table 22 in the Y-direction relative to the focal point by a distance corresponding to the interval of the division lines 72 by the Y-direction moving means 30. In addition, after the chuck table 22 is rotated by 90 degrees by the rotating means, the dividing processing is conducted while performing the indexing feeding, whereby the dividing processing is applied also to all the division lines 72 orthogonal to the division lines 72 to which the dividing processing has been applied precedingly. As a result of this, the wafer 70 can be divided into individual chips having the devices 74, through the laser processing with enhanced processing quality.

In performing the dividing processing, it is convenient that, after the first application step and the second application step are conducted in a condition where the repetition frequency of the pulsed laser beam LB oscillated by the laser oscillator 44 is set to be not more than the value obtained by dividing one second by the time required for release of heat generated in the wafer 70 upon application of the first pulsed laser beam LB1 and the second pulsed laser beam LB2 to the wafer 70, the first application step and the second application step in the next run are carried out after a time interval of not less than the time required for release of the heat generated in the wafer 70. As a result of this, thermal influences of laser processing are restrained from being exerted on the wafer 70, and enhanced quality of laser processing can be realized.

In the next place, a second embodiment of the laser processing apparatus configured according to the present invention and a laser processing method using the laser processing apparatus will be described below, referring to FIGS. 3 and 4. Note that in the second embodiment, the same constituent elements as those in the first embodiment above are denoted by the same reference symbols as used above, and descriptions thereof will be omitted.

Figure 4:
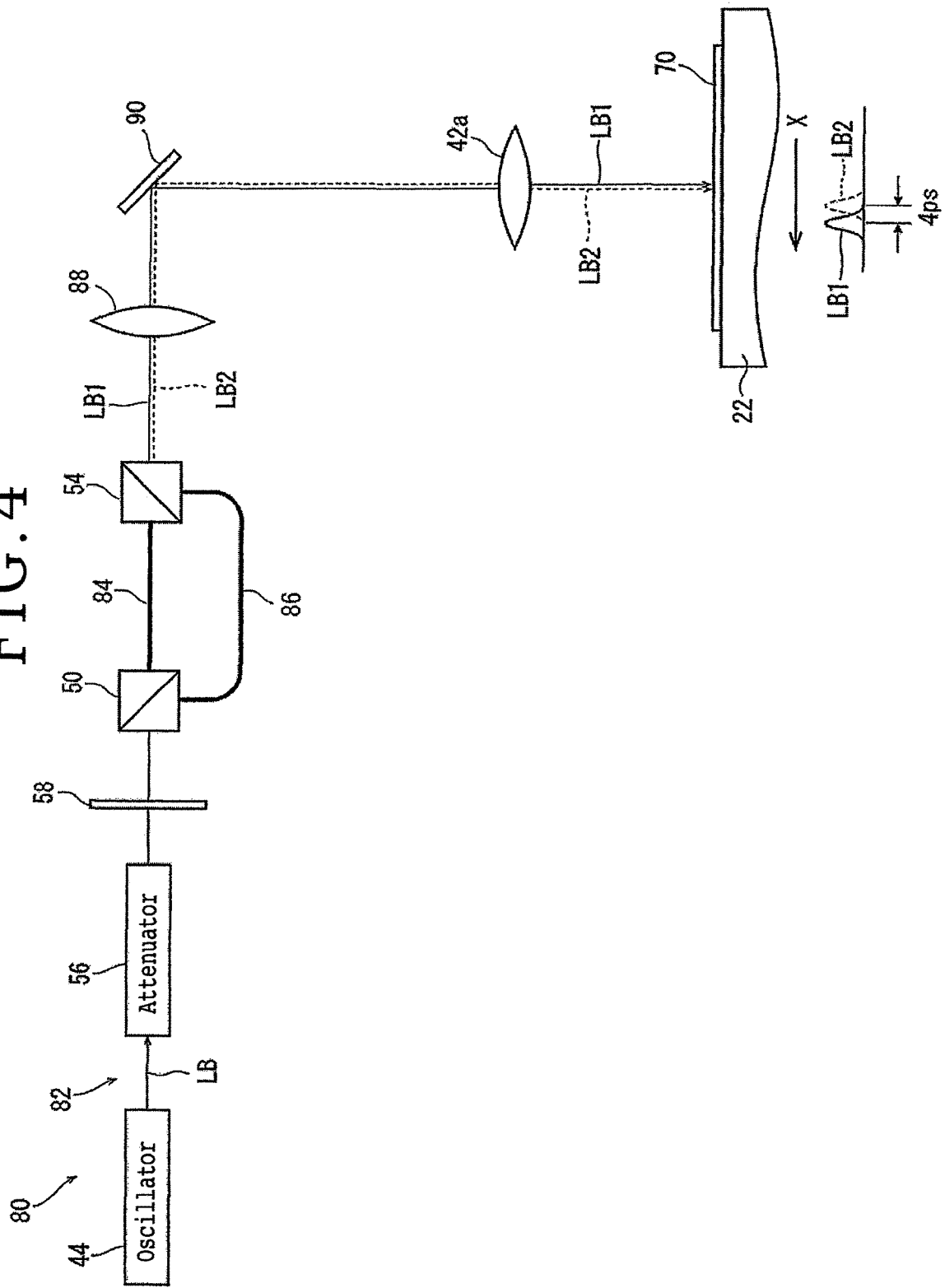
FIG. 4 is a block diagram of laser beam applying means according to a second embodiment.

As illustrated in FIG. 4, laser beam applying means 82 of a laser processing apparatus 80 includes a laser oscillator 44, a first polarization beam splitter 50, and a second polarization beam splitter 54. In addition, a first optical path 84 into which a first pulsed laser beam LB1 branched by the first polarization beam splitter 50 from a pulsed laser beam LB oscillated from the laser oscillator 44 is guided and a second optical path 86 into which a second pulsed laser beam LB2 branched by the first polarization beam splitter 50 from the pulsed laser beam LB oscillated from the laser oscillator 44 is guided are composed of optical fibers of the same material. In the laser beam applying means 82, the optical path length of the second optical path 86 is set to be longer than the optical path length of the first optical path 84 by a predetermined length, such that when the first pulsed laser beam LB1 passes through the first optical path 84 and the second pulsed laser beam LB2 passes through the second optical path 86, the second pulsed laser beam LB2 is delayed behind the first pulsed laser beam LB1 by a predetermined delay time which is less than the electron excitation time. In the second embodiment, therefore, the second optical path 86 formed to be longer than the first optical path 84 by the predetermined length constitutes a light-delaying optical body. The difference in optical path length between the first optical path 84 and the second optical path 86 is determined according to the delay time. For instance, when the workpiece is sapphire for which the electron excitation time is approximately 8 ps, the delay time is preferably set to approximately 4 ps. For producing a delay time of 4 ps, in the case where the refractive index of the optical fiber is 1.5, the optical path length difference between the first optical path 84 and the second optical path 86 is approximately 2.5 mm. Note that the first optical path 84 may be formed to be longer than the second optical path 86 by a predetermined length such that the first pulsed laser beam LB1 is delayed behind the second pulsed laser beam LB2 by a predetermined delay time of less than the electron excitation time. In addition, in the second embodiment, as depicted in FIG. 4, the laser beam applying means 82 further includes an attenuator 56, a half-wave plate 58, a collimator lens 88, and a mirror 90.

The first pulsed laser beam LB1, after passing through the first optical path 84 and the second polarization beam splitter 54, is converted into parallel light, then its optical path is changed by the mirror 90, and it is focused by the focusing lens 42a and applied to the workpiece. Besides, the second pulsed laser beam LB2 passes through the second optical path 86, and passes through the second polarization beam splitter 54 with a delay relative to the first pulsed laser beam LB1 by a predetermined delay time of less than the electron excitation time, after which it is converted into parallel light by the collimator lens 88, then its optical path is changed by the mirror 90, and it is focused by the focusing lens 42a and applied to the workpiece. In other words, the laser beam applying means 82 can apply the second pulsed laser beam LB2 to the workpiece within the time of electron excitation generated by application of the first pulsed laser beam LB1 to the workpiece.

In applying laser processing to the wafer 70 by use of the laser processing apparatus 80, a wafer holding step is first performed, then an alignment step is conducted, and thereafter a focal point position adjusting step is carried out, like in the first embodiment. Next, a first application step of applying to the wafer 70 the first pulsed laser beam LB1 having a pulse width shorter than the time of electron excitation generated by application of the laser beam to the wafer 70 and a second application step of applying the second pulsed laser beam LB2 to the wafer 70 within the electron excitation time of the wafer 70 are carried out. As aforementioned, in the laser processing apparatus 80, the pulse width of the pulsed laser beam LB oscillated by the laser oscillator 44 is set to be shorter than the electron excitation time of the workpiece, and the second pulsed laser beam LB2 can be applied to the workpiece within the time of electron excitation generated by application of the first pulsed laser beam LB1 to the workpiece. By use of the laser processing apparatus 80, therefore, it is possible to carry out the first application step and the second application step.

With the first application step and the second application step performed, the second pulsed laser beam LB2 is applied in a state in which electrons surrounding the atoms constituting the wafer 70 are activated by the first pulsed laser beam LB1, whereby processing is promoted, and enhanced quality of laser processing can be realized. After the first application step and the second application step in the first run are conducted, dividing processing in which the first application step and the second application step are alternately repeated, while performing processing feeding of the chuck table 22 in the X-direction relative to the focal point at a predetermined processing feed speed (which may, for example, be 500 mm/second and is appropriately determined taking the repetition frequency into consideration) by the X-direction moving means 28, is performed along the division lines 72, as depicted in FIG. 3. The dividing processing is applied to all the division lines 72′ aligned to the X-direction, while performing indexing feeding of the chuck table 22 in the Y-direction relative to the focal point by a distance corresponding to the interval of the division lines 72 by the Y-direction moving means 30. In addition, after the chuck table 22 is rotated by 90 degrees by the rotating means, the dividing processing is conducted while performing indexing feeding, whereby the dividing processing is applied also to all the division lines 72 orthogonal to the division lines 72 to which the dividing processing has been applied precedingly. As a result of this, the wafer 70 can be divided into individual devices 74, through the laser processing with enhanced processing quality.

In the second embodiment, also, in performing the dividing processing, it is convenient that, after the first application step and the second application step are conducted in a state in which the repetition frequency of the pulsed laser beam LB oscillated by the laser oscillator 44 is set to be not more than the value obtained by dividing one second by the time required for release of heat generated in the wafer 70 upon application of the first pulsed laser beam LB1 and the second pulsed laser beam LB2 to the wafer 70, the first application step and the second application step in the next run are performed after a time interval of not less than the time required for release of the heat generated in the wafer 70. As a result of this, thermal influences of laser processing are restrained from being exerted on the wafer 70, and enhanced quality of laser processing can be realized.

In the next place, a third embodiment of the laser processing apparatus configured according to the present invention and a laser processing method using the laser processing apparatus will be described below, referring to FIGS. 3 and 5. Note that in the third embodiment, the same constituent elements as those in the first embodiment above are denoted by the same reference symbols as used above, and descriptions thereof will be omitted.

Figure 5:
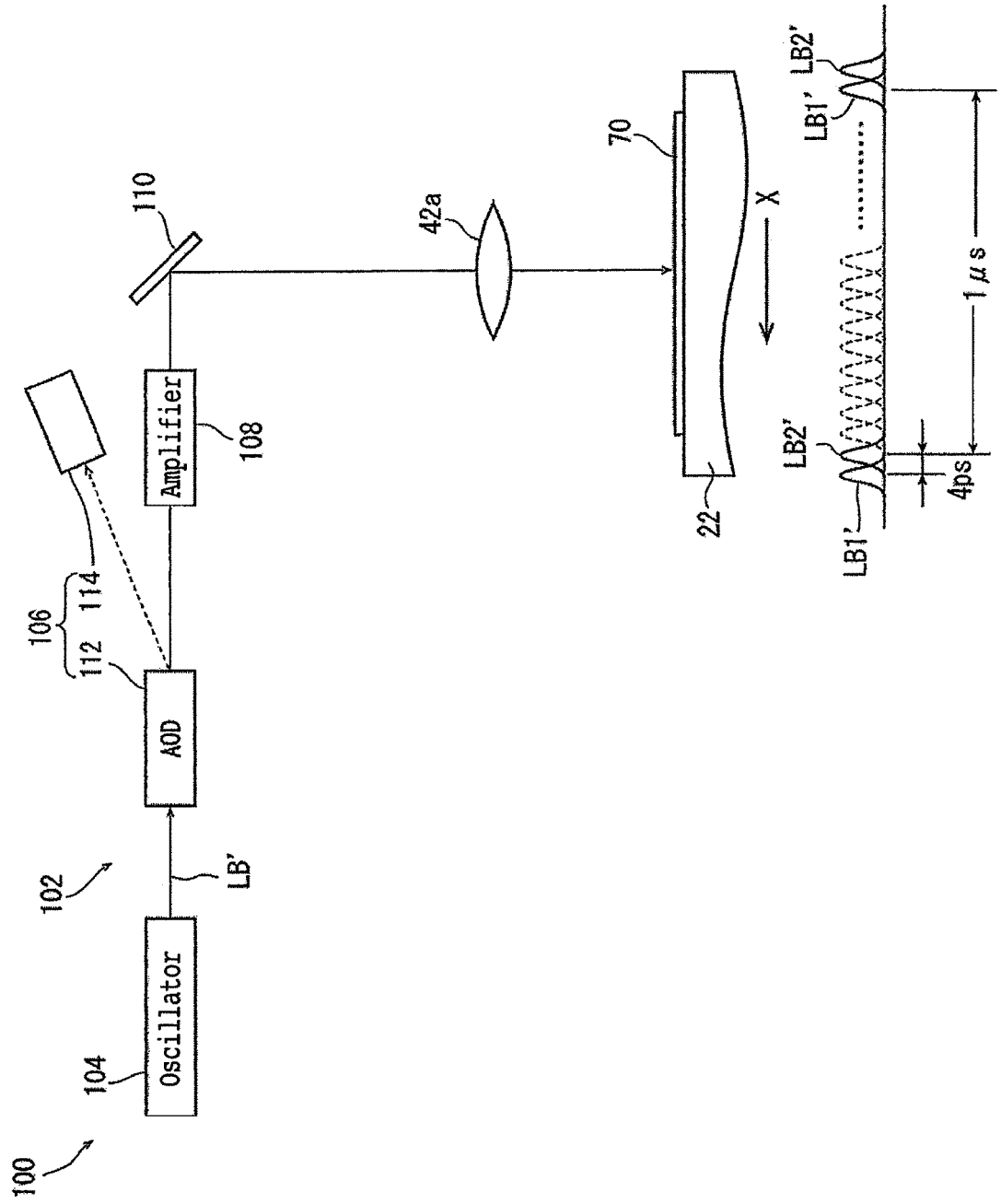
FIG. 5 is a block diagram of laser beam applying means according to a third embodiment.

As illustrated in FIG. 5, laser beam applying means 102 of a laser processing apparatus 100 includes a laser beam oscillator 104, thinning means 106, an amplifier 108, and a mirror 110. The laser beam oscillator 104 oscillates a pulsed laser beam LB′ having a pulse width shorter than the electron excitation time and in which a repetition frequency is so set as to oscillate at least two pulsed laser beams LB′ within the electron excitation time. The thinning means 106 is disposed between the laser beam oscillator 104 and a focusing lens 42*a* of a focusing unit 42 and which thins out the pulsed laser beams LB′ at a predetermined period to guide the pulsed laser beams LB′ required for processing to the focusing lens 42*a* of the focusing unit 42. The amplifier 108 is disposed between the thinning means 106 and the focusing lens 42*a* of the focusing unit 42 and which increases the output of the pulsed laser beams LB′ required for processing. The mirror 110 changes an optical path of the pulsed laser beams LB′ amplified by the amplifier 108 to guide the pulsed laser beams LB′ to the focusing lens 42*a* of the focusing unit 42.

The pulse width of the pulsed laser beams LB′ oscillated by the laser oscillator 104 is shorter than the electron excitation time; for example, in the case where the workpiece is sapphire ($Al_2O_3$) for which the electron excitation time is approximately 8 ps ($8\times10^{-12}$ second), the pulse width is preferably set to approximately 1 ps. The wavelength of the pulsed laser beams LB′ oscillated by the laser oscillator 104 is appropriately determined according to the kind of processing, and is, for example, 355 nm, 1064 nm or the like. In addition, the repetition frequency of the pulsed laser beams LB′ oscillated by the laser oscillator 104 is so set as to oscillate at least two pulsed laser beams LB′ within the electron excitation time; for example, in the case where the workpiece is sapphire for which the electron excitation time is approximately 8 ps, the repetition frequency is conveniently set to 250 GHz ($250\times10^9$ Hz). As a result of this, the oscillation interval of the pulsed laser beams LB′ is 4 ps, whereby the laser oscillator 104 can oscillate at least two pulsed laser beams LB′ within the electron excitation time of sapphire. In this way, in the laser oscillator 104, the pulsed laser beams LB′ having a pulse width shorter than the electron excitation time are oscillated, and the repetition frequency is so set as to oscillate at least two pulsed laser beams LB′ within the electron excitation time. Therefore, the laser beam applying means 102 can apply a second pulsed laser beam LB2′ to the workpiece within the time of electron excitation generated upon application of a first pulsed laser beam LB1′ to the workpiece.

In the present embodiment, as depicted in FIG. 5, the thinning means 106 includes an acousto-optic device (AOD) 112 that changes an optical path according to a voltage signal impressed thereon, and a damper 114 that absorbs the pulsed laser beams LB′ of which the optical path has been changed. The AOD 112 is so configured as to guide the pulsed laser beam LB′ oscillated by the laser oscillator 104 to the amplifier 108 when no voltage signal is impressed thereon, and to guide the pulsed laser beam LB′ oscillated by the laser oscillator 104 to the damper 114 when a predetermined voltage signal is impressed thereon. It is preferable that the thinning means 106 thins out the pulsed laser beams LB′ in such a manner that the time after application of at least two pulsed laser beams LB′ to the workpiece until application of next at least two pulsed laser beams LB′ to the workpiece is not less than the time required for release of heat generated upon application of the preceding at least two pulsed laser beams LB′ to the workpiece. As a result of this, thermal influences of laser processing are restrained from being exerted on the workpiece, and enhanced quality of laser processing can be realized. For example, in the case where the workpiece is sapphire for which the heat release time is approximately 1 μs ($1\times10^{-6}$ second), it is preferable to thin out the pulsed laser beams LB′ by the thinning means 106 in such a manner that the time after application of the first pulsed laser beam LB1′ and the second pulsed laser beam LB2' to the workpiece until application of the first pulsed laser beam LB1' and the second pulsed laser beam LB2' in the next run to the workpiece is not less than the heat release time of sapphire (approximately 1 µs), as depicted in FIG. 5. In FIG. 5, the pulsed laser beams LB' thinned out by the thinning means 106 are indicated by dotted lines. Besides, in the present embodiment, the amplifier 108 that increases the output of the pulsed laser beam LB' is disposed between the thinning means 106 and the focusing lens 42a, or in a place where most of the pulsed laser beams LB' oscillated by the laser oscillator 104 are thinned out by the thinning means 106; for this reason, the output of the pulsed laser beams LB' oscillated by the laser oscillator 104 may be comparatively low, and, accordingly, a lowering in energy efficiency is restrained.

In performing laser processing to the wafer 70 by the laser processing apparatus 100, a wafer holding step is first conducted, then an alignment step is performed, and thereafter a focal point position adjusting step is carried out, like in the first and second embodiments. Next, a first application step of applying to the wafer 70 the first pulsed laser beam LB1' having a pulse width shorter than the time of electron excitation generated by application of the laser beam to the wafer 70 and a second application step of applying a second pulsed laser beam LB2' to the wafer 70 within the electron excitation time are carried out. As aforementioned, in the laser processing apparatus 100, the pulse width of the pulsed laser beams LB' oscillated by the laser oscillator 104 is set to be shorter than the electron excitation time of the workpiece, and the second pulsed laser beam LB2' can be applied to the workpiece within the time of electron excitation generated by application of the first pulsed laser beam LB1' to the workpiece; therefore, it is possible to perform the first application step and the second application step by use of the laser processing apparatus 100. With the first application step and the second application step carried out, the second pulsed laser beam LB2' is applied in a state in which electrons surrounding the atoms constituting the wafer 70 are activated by the first pulsed laser beam LB1', whereby processing is promoted, and enhanced quality of laser processing can be realized.

After the first application step and the second application step in the first run are conducted, dividing processing in which the first application step and the second application step are alternately repeated, while performing processing feeding of the chuck table 22 in the X-direction relative to the focal point at a predetermined processing feed speed (which may be, for example, 500 mm/second, and is appropriately determined taking the repetition frequency into consideration) by the X-direction moving means 28, is performed along the division lines 72, as depicted in FIG. 3. The dividing processing is applied to all the division lines 72 aligned to the X-direction, while performing indexing feeding of the chuck table 22 in the Y-direction relative to the focal point by a distance corresponding to the interval of the division lines 72 by the Y-direction moving means 30. In addition, after the chuck table 22 is rotated by 90 degrees by the rotating means, the dividing processing is conducted while performing the indexing feeding, whereby the dividing processing is applied also to all the division lines 72 orthogonal to the division lines 72 to which the dividing processing has been applied precedingly. As a result of this, the wafer 70 can be divided into individual chips having the devices 74, through the laser processing with enhanced processing quality.

In performing the dividing processing, it is convenient to thin out the pulsed laser beams LB' by the thinning means 106 in such a manner that the time after application of the first pulsed laser beam LB1' and the second pulsed laser beam LB2' to the wafer 70 until application of the first pulsed laser beam LB1' and the second pulsed laser beam LB2' in the next run to the wafer 70 is not less than the time required for release of heat generated in the wafer 70 upon the application of the first pulsed laser beam LB1' and the second pulsed laser beam LB2' in the preceding run to the wafer 70. As a result of this, thermal influences of laser processing are restrained from being exerted on the wafer 70, and enhanced quality of laser processing can be realized.

In the next place, a fourth embodiment of the laser processing apparatus configured according to the present invention and a laser processing method using the laser processing apparatus will be described below referring to FIGS. 3 and 6. Note that in the fourth embodiment, the same constituent elements as those in the first embodiment above are denoted by the same reference symbols as used above, and descriptions thereof will be omitted.

Figure 6:
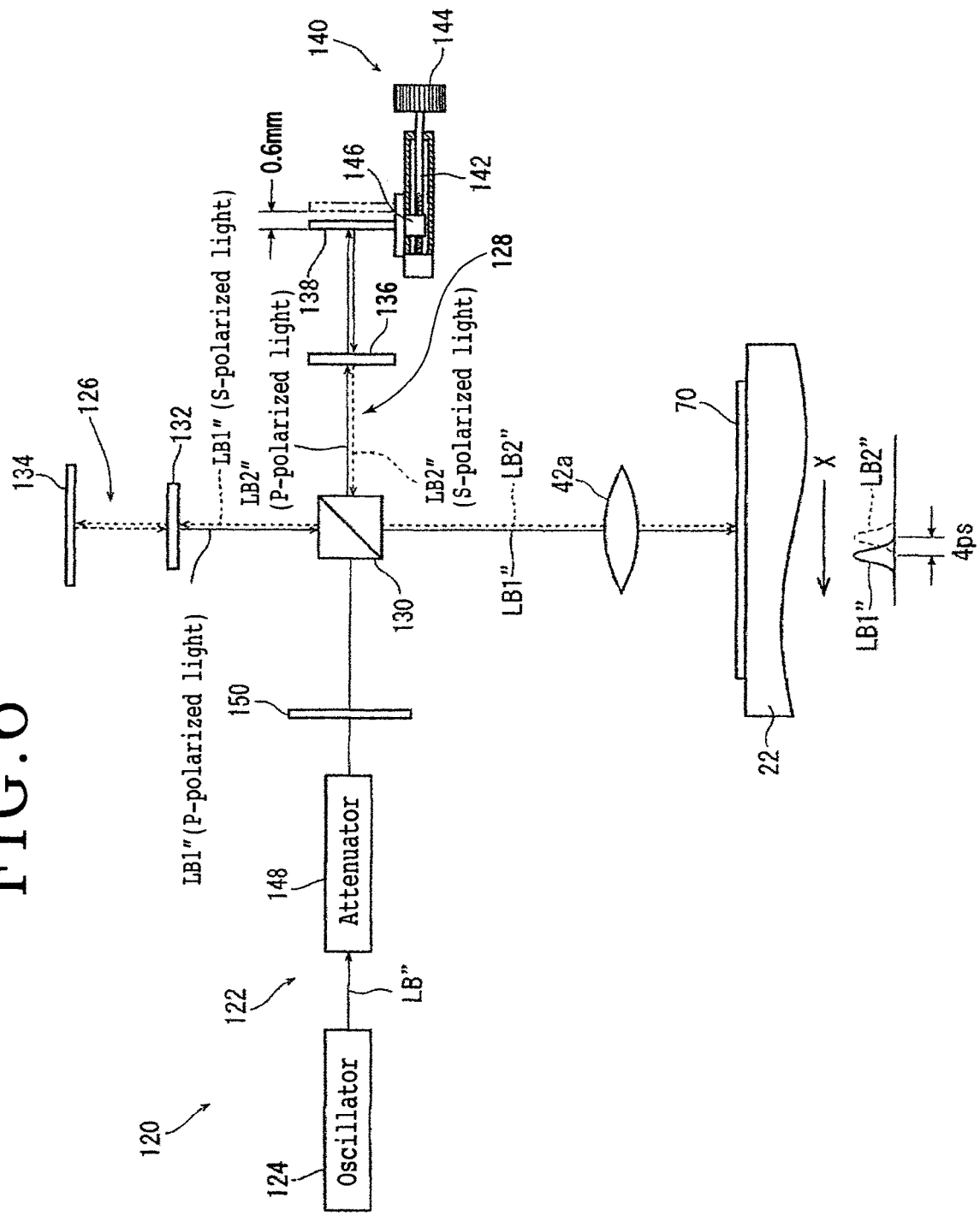
FIG. 6 is a block diagram of laser beam applying means according to a fourth embodiment.

As illustrated in FIG. 6, laser beam applying means 122 of a laser processing apparatus 120 includes a laser oscillator 124 that oscillates a pulsed laser beam LB" having a pulse width shorter than the electron excitation time, and a polarization beam splitter 130 that branches the pulsed laser beam LB" oscillated by the laser oscillator 124, guides a first pulsed laser beam LB1" as s-polarized light into a first optical path 126 and guides a second pulsed laser beam LB2" as p-polarized light into a second optical path 128. In the first optical path 126, there are disposed a first quarter-wave plate 132 that converts the first pulsed laser beam LB1" as the s-polarized light into circularly polarized light, and a first mirror 134 that reflects the first pulsed laser beam LB1" as the circularly polarized light having passed through the first quarter-wave plate 132, thereby reversing the rotating direction of the circularly polarized light, and causes the circularly polarized light to reversely pass through the first quarter-wave plate 132, thereby converting the circularly polarized light into p-polarized light. In the second optical path 128, there are disposed a second quarter-wave plate 136 that converts the second pulsed laser beam LB2" as p-polarized light into circularly polarized light, and a second mirror 138 that reflects the second pulsed laser beam LB2" as the circularly polarized light having passed through the second quarter-wave plate 136, thereby reversing the rotating direction of the circularly polarized light, and causes the circularly polarized light to reversely pass through the second quarter-wave plate 136, thereby converting the circularly polarized light into s-polarized light.

In the present embodiment, advancing/retracting means 140 for advancing or retracting the second mirror 138 in relation to the polarization beam splitter 130 to provide an optical path length difference between the first optical path 126 and the second optical path 128 is mounted to the second mirror 138. The advancing/retracting means 140 in the present embodiment includes a ball screw 142 extending in parallel to the second optical path 128, and a motor 144 connected to one end portion of the ball screw 142. A nut portion 146 of the ball screw 142 is fixed to the second mirror 138. The advancing/retracting means 140 converts a rotational motion of the motor 144 into a rectilinear motion and transmits the rectilinear motion to the second mirror 138, by the ball screw 142, thereby advancing or retracting the second mirror 138 along guide rails (not depicted) extending in parallel to the second optical path 128. Note that the advancing/retracting means 140 may be mounted to the first mirror 134. In addition, a rotational motion may be imparted to the ball screw 142 of the advancing/retracting means 140 manually, instead of using the motor 144. In the present embodiment, as depicted in FIG. 6, the laser beam applying means 122 further includes an attenuator 148 that adjusts the output of the pulsed laser beam LB" oscillated by the laser oscillator 124, and a half-wave plate 150 disposed between the laser oscillator 124 and the polarization beam splitter 130 (in the present embodiment, between the attenuator 148 and the polarization beam splitter 130).

The optical path length difference between the first optical path 126 and the second optical path 128 is set in such a manner that the time interval between application of the first pulsed laser beam LB1" to the workpiece and application of the second pulsed laser beam LB2" to the workpiece is within the electron excitation time. For instance, in the case where the workpiece is sapphire ($Al_2O_3$) for which the electron excitation time is approximately 8 ps ($8 \times 10^{-12}$ second), the time interval between application of the first pulsed laser beam LB1" to the workpiece and application of the second pulsed laser beam LB2" to the workpiece is preferably set to approximately 4 ps, and, for the purpose of such a setting, the optical path length difference between the first optical path 126 and the second optical path 128 is approximately 1.2 mm. As illustrated in FIG. 6, since the second pulsed laser beam LB2" reciprocates in the second optical path 128, for setting the optical path length difference between the first optical path 126 and the second optical path 128 to 1.2 mm it is sufficient to move the second mirror 138 by the advancing/retracting means 140 in such a manner that the distance from the polarization beam splitter 130 to the second mirror 138 will be longer by 0.6 mm than the distance from the polarization beam splitter 130 to the first mirror 134. Note that in the present embodiment, the first quarter-wave plate 132 and the second quarter-wave plate 136 are formed from the same material and in the same thickness.

The pulse width of the pulsed laser beam LB" oscillated by the laser oscillator 124 is shorter than the electron excitation time; for example, in the case where the workpiece is sapphire for which the electron excitation time is approximately 8 ps, the pulse width is preferably set to approximately 1 ps. The wavelength of the pulsed laser beam LB" oscillated by the laser oscillator 124 is appropriately determined according to the kind of processing, and is, for example, 355 nm, 1064 nm or the like. The pulsed laser beam LB" oscillated by the laser oscillator 124 is appropriately adjusted in output according to the kind of processing by the attenuator 148, before being incident on the half-wave plate 150. Of the pulsed laser beam LB" incident on the half-wave plate 150, the quantity of a p-polarized light component with plane of polarization being p-polarized light when incident on the polarization beam splitter 130 and the quantity of an s-polarized light component with plane of polarization being s-polarized light when incident on the polarization beam splitter 130 are adjusted appropriately (for example, adjusted to be equal) by the half-wave plate 150. The polarization beam splitter 130 is so configured as to reflect the s-polarized light component of the incident pulsed laser beam LB", thereby guiding the first pulsed laser beam LB1" into the first optical path 126, and to transmit the p-polarized light component of the incident pulsed laser beam LB", thereby guiding the second pulsed laser beam LB2" into the second optical path 128. The first pulsed laser beam LB1" guided into the first optical path 126 is converted from s-polarized light into circularly polarized light by the first quarter-wave plate 132, is then reflected by the first mirror 134, with the rotating direction of the circularly polarized light being reversed thereby, subsequently passes reversely through the first optical path 126, and is converted into p-polarized light by the first quarter-wave plate 132. The first pulsed laser beam LB1" thus converted into p-polarized light is transmitted through the polarization beam splitter 130, and is focused by the focusing lens 42a of the focusing unit 42, to be applied to the workpiece.

On the other hand, the second pulsed laser beam LB2" guided into the second optical path 128 is converted from p-polarized light into circularly polarized light by the second quarter-wave plate 136, is then reflected by the second mirror 138, with the rotating direction of the circularly polarized light being reversed thereby, subsequently passes reversely through the second optical path 128, and is converted into s-polarized light by the second quarter-wave plate 136. The second pulsed laser beam LB2" thus converted into s-polarized light is reflected by the polarization beam splitter 130, with its optical path being changed thereby, and is focused by the focusing lens 42a of the focusing unit 42, to be applied to the workpiece. While the first pulsed laser beam LB1" and the second pulsed laser beam LB2" might join each other in the polarization beam splitter 130, the second pulsed laser beam LB2" passing through the second optical path 128, which is longer by the predetermined optical path length as above-mentioned, is applied to the workpiece with a delay of a predetermined time of less than the electron excitation time in relation to the first pulsed laser beam LB1". Thus, in the laser beam applying means 122, the second pulsed laser beam LB2" can be applied to the workpiece within the time of electron excitation generated upon application of the first pulsed laser beam LB1" to the workpiece.

The repetition frequency of the pulsed laser beam LB" oscillated by the laser oscillator 124 is conveniently set to be not more than a value obtained by dividing one second by the time required for release of heat generated in the workpiece upon application of the first pulsed laser beam LB1" and the second pulsed laser beam LB2" to the workpiece. For example, in the case where the workpiece is sapphire for which the heat release time is approximately 1 μs ($1 \times 10^{-6}$ second), the value obtained by dividing one second by the heat release time for sapphire of 1 μs is $1 \times 10^6$, and, therefore, the repetition frequency of the pulsed laser beam LB" oscillated by the laser oscillator 124 is preferably set to be not more than 1 MHz ($1 \times 10^6$ Hz). With the repetition frequency set in this way, the laser beam applying means 122, after applying the first pulsed laser beam LB1" and the second pulsed laser beam LB2" to the workpiece, applies the first pulsed laser beam LB1" and the second pulsed laser beam LB2" in the next run to the workpiece after a time interval of not less than the heat release time. As a result of this, thermal influences of laser processing are restrained from being exerted on the workpiece, and enhanced quality of laser processing can be realized.

In applying laser processing to the wafer 70 by use of the laser processing apparatus 120, a wafer holding step is first conducted, then an alignment step is performed, and thereafter a focal point position adjusting step is carried out, like in the first to third embodiments. Next, a first application step of applying to the wafer 70 a first pulsed laser beam LB1" having a pulse with shorter than the time of electron excitation generated by application of the laser beam to the wafer 70 and a second application step of applying a second pulsed laser beam LB2" to the wafer 70 within the electron excitation time are carried out. As aforementioned, in the laser processing apparatus 120, the pulse width of the pulsed laser beam LB" oscillated by the laser oscillator 124 is set to be shorter than the electron excitation time of the workpiece, and the second pulsed laser beam LB2" can be applied to the workpiece within the time of electron excitation generated upon application of the first pulsed laser beam LB1" to the workpiece. By use of the laser processing apparatus 120, therefore, it is possible to carry out the first application step and the second application step. With the first application step and the second application step carried out, the second pulsed laser beam LB2" is applied to the wafer 70 in a state in which electrons surrounding the atoms constituting the wafer 70 are activated by the first pulsed laser beam LB1", whereby processing is promoted, and enhanced quality of laser processing can be realized.

After the first application step and the second application step in the first run are conducted, dividing processing in which the first application step and the second application step are alternately repeated while performing processing feeding of the chuck table 22 in the X-direction relative to the focal point at a predetermined processing feed speed (which may, for example, be 500 mm/second, and is appropriately determined taking the repetition frequency into consideration) by the X-direction moving means 28, is performed along the division lines 72, as depicted in FIG. 3. The dividing processing is applied to all the division lines 72 aligned to the X-direction, while performing indexing feeding of the chuck table 22 in the Y-direction relative to the focal point by a distance corresponding to the interval of the division lines 72 by the Y-direction moving means 30. In addition, after the chuck table 22 is rotated by 90 degrees by the rotating means, the dividing processing is conducted while performing the indexing feeding, whereby the dividing processing is applied also to all the division lines 72 orthogonal to the division lines 72 to which the dividing processing has been applied precedingly. As a result of this, the wafer 70 can be divided into individual chips having the devices 74, through the laser processing with enhanced processing quality.

In performing the dividing processing, it is convenient to set the repetition frequency of the pulsed laser beam LB" oscillated by the laser oscillator 124 to be not more than the value obtained by dividing one second by the time required for release of heat generated in the wafer 70 upon application of the first pulsed laser beam LB1" and the second pulsed laser beam LB2" to the wafer 70, thereby conducting the first application step and the second application step, and thereafter to perform the first application step and the second application step in the next run after a time interval of not less than the time required for release of heat generated in the wafer 70. As a result of this, thermal influences of laser processing are restrained from being exerted on the wafer 70, and enhanced quality of laser processing can be realized.

Note that the electron excitation time and the heat release time vary depending on the workpiece, and, for example, the respective values of electron excitation time and heat release time for sapphire ($Al_2O_3$), silicon (Si), lithium tantalate ($LiTaO_3$), lithium niobate ($LiNbO_3$), and copper (Cu) are as set forth below.

| Workpiece | Electron excitation time | Heat release time |
|---|---|---|
| Sapphire | 8 ps | 1 µs |
| Silicon | 20 ps | 5 µs |
| Lithium tantalate | 50 ps | 50 µs |
| Lithium niobate | 50 ps | 50 µs |
| Copper | 20 ps | 5 µs |

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A laser processing method for processing a workpiece by applying a laser beam to the workpiece, the laser processing method comprising:
providing a pulsed laser beam having a pulse width less than an electron excitation time;
splitting the pulsed laser beam into first laser beam having a first optical path and a second laser beam having a second optical path;
delaying the first laser beam in relation to the second laser beam or delaying the second laser beam in relation to the first laser beam;
applying the first laser beam to the workpiece; and
applying the second laser beam to the workpiece;
wherein the first laser beam or the second laser beam is applied to the workpiece with a delay of a predetermined delay time within the electron excitation time.

2. The laser processing method of claim 1 further comprising:
repeating application of the first and second laser beams to the workpiece after a time interval of not less than a time required for release of heat generated in the workpiece.

3. The laser processing method of claim 1 wherein delaying the first laser beam in relation to the second laser beam or delaying the second laser beam in relation to the first laser beam comprises delaying the first laser beam in relation to the second laser beam or delaying the second laser beam in relation to the first laser beam by a time shorter than the electron excitation time.

4. The laser processing method of claim 1 wherein delaying the first laser beam in relation to the second laser beam or delaying the second laser beam in relation to the first laser beam comprises introducing the first laser beam or the second laser beam into a light-delaying optical body.

5. The laser processing method of claim 1 wherein delaying the first laser beam in relation to the second laser beam or delaying the second laser beam in relation to the first laser beam comprises introducing the first laser beam into the first optical path which is longer than the second optical path or introducing the second laser beam into the second optical path which is longer than the first optical path.

6. The laser processing method of claim 1 wherein splitting the pulsed laser beam into the first laser beam having the first optical path and the second laser beam having the second optical path comprises introducing the pulsed laser beam into a polarization beam splitter forming the first and second laser beams.

7. The laser processing method of claim 6 wherein the polarization beam splitter is configured to transmit a p-polarized light component and to reflect an s-polarized light component.

8. The laser processing method of claim 7 wherein the first laser beam comprises the s-polarized light component and the second laser beam comprises the p-polarized light component, the method further comprising:
converting the first laser beam comprising the s-polarized light component into the first laser beam comprising a first circularly polarized light component;
reflecting the first laser beam comprising the first circularly polarized light component;

converting the first laser beam comprising the first circularly polarized light component into the first laser beam comprising a converted p-polarized light component;

converting the second laser beam comprising the p-polarized light component into the second laser beam comprising a second circularly polarized light component;

reflecting the second laser beam comprising the second circularly polarized light component;

converting the second laser beam comprising the second circularly polarized light component into the second laser beam comprising a converted s-polarized light component; and passing the first laser beam comprising the converted p-polarized light component and the second laser beam comprising the converted s-polarized light component through the polarization beam splitter;

wherein the first optical path is longer than the second optical path or wherein the second optical path is longer than the first optical path.

9. The laser processing method of claim 1 further comprising joining the first laser beam and the second laser beam.

10. The laser processing method of claim 9 wherein joining the first laser beam and the second laser beam comprises introducing the first laser beam and the second laser beam into a second polarization beam splitter to join the first and second optical paths.

11. The laser processing method of claim 10 wherein the second polarization beam splitter is configured to transmit a p-polarized light component and to reflect an s-polarized light component.

12. A laser processing method for processing a workpiece by applying a laser beam to the workpiece, the laser processing method comprising:

providing a pulsed laser beam having a pulse width less than an electron excitation time and a repetition frequency to oscillate at least two pulsed laser beams within the electron excitation time;

thinning the pulsed laser beams at a predetermined period forming thinned pulsed laser beams;

amplifying the thinned pulsed laser beams;

focusing the thinned pulsed laser beams;

applying the first thinned pulsed laser beam to the workpiece; and applying the second thinned pulsed laser beam to the workpiece;

wherein the second thinned pulsed laser beam is applied to the workpiece with a delay of a predetermined delay time within the electron excitation time.

13. The laser processing method of claim 12 wherein thinning the pulsed laser beams comprises passing the pulsed laser beam to an amplifier when no voltage is impressed thereon and guiding the pulsed laser beam to a damper when voltage is impressed thereon.

14. A laser processing apparatus comprising:
a chuck table adapted to hold a workpiece; and
a laser beam oscillator adapted to oscillate a pulsed laser beam having a pulse width shorter than an electron excitation time generated by application of the laser beam to the workpiece; and
at least one polarization beam splitter configured to transmit a p-polarized light component and to reflect an s-polarized light component for splitting the pulsed laser beam into a first laser beam having a first optical path and a second laser beam having a second optical path;
wherein a second laser beam is applied to the workpiece within the electron excitation time of the laser beam.

15. The apparatus of claim 14 further comprising:
a light-delaying optical body in the first optical path or the second optical path.

16. The apparatus of claim 14 wherein the first optical path is longer than the second optical path, or the second optical path is longer than the first optical path.

17. The apparatus of claim 14 wherein there is a second polarization beam splitter configured to transmit a p-polarized light component and to reflect an s-polarized light component for joining the first and second laser beams.

18. The apparatus of claim 14 further comprising at least one half-wave plate.

19. The apparatus of claim 14 further comprising at least one mirror.

20. A laser processing apparatus comprising:
a chuck table adapted to hold a workpiece;
a laser beam oscillator adapted to oscillate a pulsed laser beam having a pulse width shorter than an electron excitation time generated by application of the laser beam to the workpiece and having a repetition frequency set to oscillate at least two pulsed laser beams within the electron excitation time;
a focusing unit disposed between the laser beam oscillator and the chuck table, the focusing unit comprising a focusing lens;
a thinning means disposed between the laser beam oscillator and the focusing lens, the thinning means comprising an acousto-optical device that changes an optical path based on an impressed voltage signal and a damper that absorbs a pulsed laser beam having a changed optical path, wherein the acousto-optical device is configured to guide the pulsed laser beam to the amplifier when no voltage signal is impressed and to guide the pulsed laser beam to the damper when a predetermined voltage signal is impressed;
an amplifier disposed between the thinning means and the focusing lens; and
a mirror disposed between the amplifier and the focusing lens to change the optical path of the pulsed laser beam;
wherein a second laser beam is applied to the workpiece within the electron excitation time of the laser beam.

* * * * *